(12) United States Patent
Tang et al.

(10) Patent No.: US 10,177,753 B2
(45) Date of Patent: Jan. 8, 2019

(54) TECHNIQUES FOR GENERATING PULSE-WIDTH MODULATION DATA

(71) Applicant: Altera Corporation, San Jose, CA (US)

(72) Inventors: Lai Guan Tang, Tanjung Bungah (MY); Kang Syn Ting, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 203 days.

(21) Appl. No.: 15/230,150

(22) Filed: Aug. 5, 2016

(65) Prior Publication Data

US 2018/0041201 A1 Feb. 8, 2018

(51) Int. Cl.
| | | |
|---|---|---|
| H03K 3/00 | (2006.01) | |
| H03K 7/08 | (2006.01) | |
| H02M 1/14 | (2006.01) | |
| H02M 3/00 | (2006.01) | |

(52) U.S. Cl.
CPC ............... *H03K 7/08* (2013.01); *H02M 1/14* (2013.01); *H02M 3/00* (2013.01)

(58) Field of Classification Search
CPC ............. H03K 7/08; H02M 1/14; H02M 3/00
USPC .................. 327/170, 172–176; 323/280–287
See application file for complete search history.

(56) References Cited

U.S. PATENT DOCUMENTS

| | | | |
|---|---|---|---|
| 5,317,248 A | 5/1994 | Utley et al. | |
| 6,064,404 A | 5/2000 | Aras et al. | |
| 6,138,047 A | 10/2000 | Proffitt et al. | |
| 6,801,009 B2 | 10/2004 | Makaran et al. | |
| 7,932,761 B1 | 4/2011 | Esposito | |
| 2003/0062863 A1 | 4/2003 | Huang et al. | |
| 2005/0242858 A1 | 11/2005 | Figoli et al. | |
| 2009/0278567 A1* | 11/2009 | Suzuki | H03K 19/0185 326/80 |
| 2011/0299351 A1 | 12/2011 | Schultz et al. | |
| 2012/0260002 A1 | 10/2012 | Hildebran et al. | |
| 2015/0002117 A1* | 1/2015 | Labib | H02M 3/158 323/282 |
| 2015/0077181 A1* | 3/2015 | Talwalkar | H03F 3/2175 330/251 |

(Continued)

OTHER PUBLICATIONS

U.S. Appl. No. 15/087,892, "Pulse-Width Modulation Voltage Identification Interface," Lai Guan Tang et al., filed Mar. 31, 2016.

(Continued)

*Primary Examiner* — Thomas Skibinski

(74) *Attorney, Agent, or Firm* — Steven J. Cahill

(57) ABSTRACT

An integrated circuit includes a control circuit, a first-in first-out circuit, and a serializer circuit. The control circuit generates parallel pulse-width modulation data in first parallel pulse-width modulation signals. The first-in first-out circuit stores the parallel pulse-width modulation data indicated by the first parallel pulse-width modulation signals. The first-in first-out circuit outputs the stored parallel pulse-width modulation data in second parallel pulse-width modulation signals. The serializer circuit converts the parallel pulse-width modulation data indicated by the second parallel pulse-width modulation signals to serial pulse-width modulation data in a serial pulse-width modulation signal.

20 Claims, 4 Drawing Sheets

(56) References Cited

U.S. PATENT DOCUMENTS

2016/0011611 A1    1/2016  Yuan et al.

OTHER PUBLICATIONS

Korean Intellectual Property Office, International Search Report for international application PCT/US2017/041059, dated Oct. 17, 2017, pp. 1-4.
Korean Intellectual Property Office, Written Opinion of the International Searching Authority for international application PCT/US2017/041059, dated Oct. 16, 2017, pp. 1-9.

* cited by examiner

TECHNIQUES FOR GENERATING PULSE-WIDTH MODULATION DATA

FIELD OF THE DISCLOSURE

The present disclosure relates to electronic circuits, and more particularly, to techniques for generating pulse-width modulation data using electronic circuits.

BACKGROUND

Pulse-width modulation (PWM) is a technique that is used to encode data into a pulsing signal. PWM can be used, for example, to encode data for transmission or to control the power supplied to electrical devices, such as integrated circuits or motors. A voltage regulator may use PWM to control a voltage and a current provided to a load by turning a switch that is coupled between an input voltage source and the load on and off. The duration of time that the switch is on in each switching period of the switch determines the total power supplied to the load.

BRIEF SUMMARY

According to some embodiments, an integrated circuit includes a control circuit, a first-in first-out circuit, and a serializer circuit. The control circuit generates parallel pulse-width modulation data in first parallel pulse-width modulation signals. The first-in first-out circuit stores the parallel pulse-width modulation data indicated by the first parallel pulse-width modulation signals. The first-in first-out circuit outputs the stored parallel pulse-width modulation data in second parallel pulse-width modulation signals. The serializer circuit converts the parallel pulse-width modulation data indicated by the second parallel pulse-width modulation signals to serial pulse-width modulation data in a serial pulse-width modulation signal.

Embodiments of the present invention can be implemented in numerous ways, such as a process, an apparatus, a system, or a device. Various objects, features, and advantages of the present invention will become apparent upon consideration of the following detailed description and the accompanying drawings.

DETAILED DESCRIPTION

A previously known implementation of a circuit that generates a pulse-width modulation (PWM) signal has a counter that operates at a clock frequency that is based on the minimum pulse width that the circuit can generate in a varying logic signal. For example, if the minimum pulse width that the circuit can generate is 1 microsecond, the counter needs to run at 1 megahertz (MHz). A counter that runs at a clock frequency of the minimum pulse width limits the maximum frequency of the PWM output signal. A counter based PWM circuit is not flexible enough to generate PWM signals that are targeted for different protocols.

According to some embodiments, a system for generating a PWM signal includes a control circuit, a first-in first-out (FIFO) circuit, and a serializer circuit. The control circuit generates parallel pulse-width modulation (PWM) signals that indicate parallel PWM data. The parallel PWM data in the parallel PWM signals is provided from the control circuit to the serializer circuit through the FIFO circuit. The serialier circuit converts the parallel PWM data into serial PWM data and outputs the serial PWM data in a serial PWM signal.

These embodiments may allow the serial PWM data to be transmitted at a higher data rate than can be generated by the control circuit for the parallel PWM data. These embodiments may allow the control circuit to operate at a lower clock frequency than the frequency of the serial PWM signal, which may ease the timing requirements imposed on the design of the control circuit. The serialization rate of the serializer circuit may be determined by the ratio between the clock frequency of the control circuit and the data rate of the serial PWM signal. In some embodiments, the control circuit may be programmed to generate PWM data according to different PWM protocols, for example, by programming or re-programming the control circuit using software or different configuration data.

Figure 1:
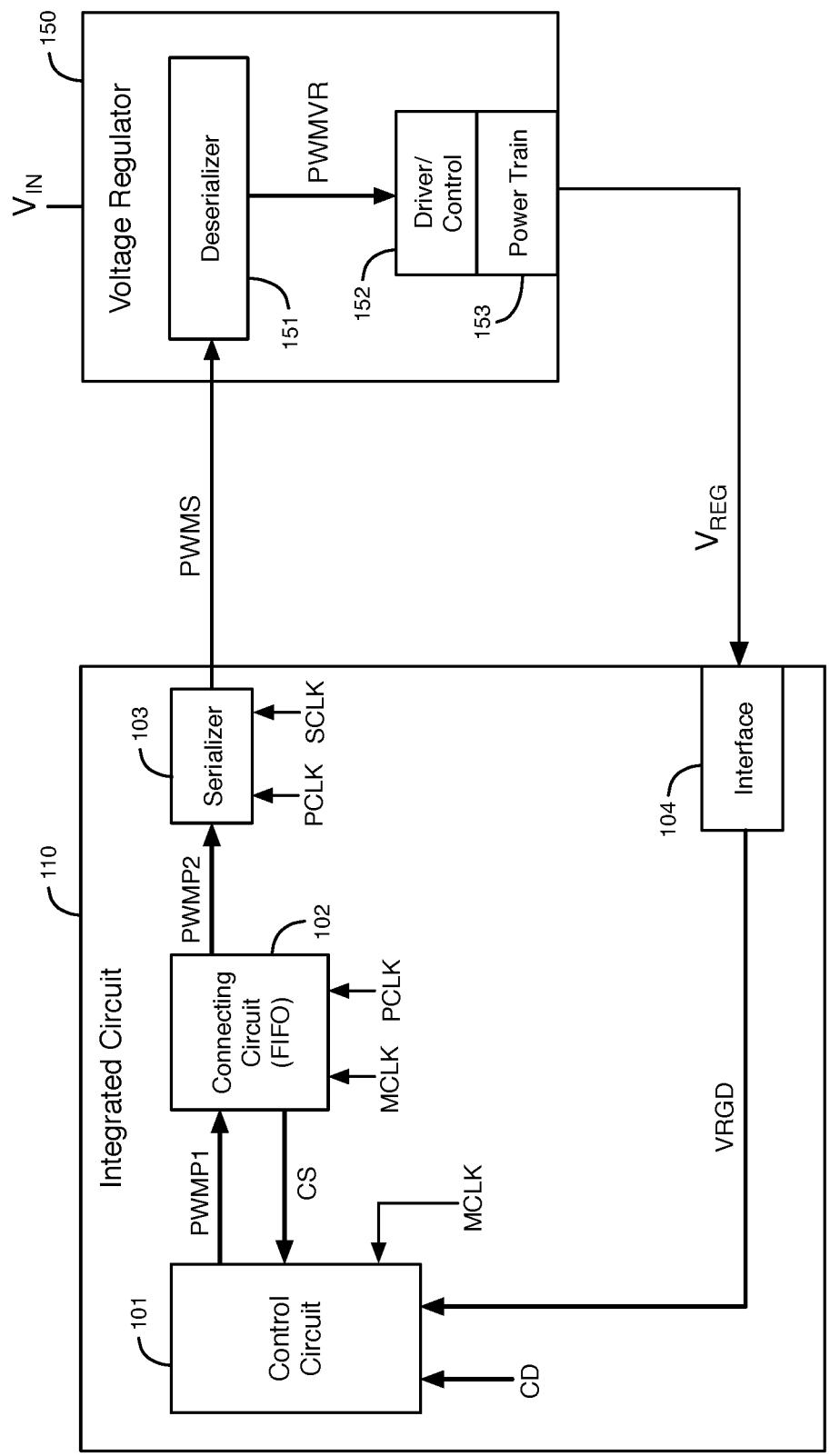
FIG. 1 illustrates a pulse-width modulation (PWM) control system for a voltage regulator, according to an embodiment of the present invention.

FIG. 1 illustrates a pulse-width modulation (PWM) control system for a voltage regulator, according to an embodiment of the present invention. FIG. 1 illustrates an integrated circuit (IC) 110 and a voltage regulator circuit 150. Integrated circuit 110 may be, for example, a microprocessor, a central processing unit, or a programmable logic integrated circuit, to name a few examples. Examples of programmable logic integrated circuits include field programmable gate arrays (FPGAs), programmable logic devices (PLDs), programmable logic arrays (PLAs), etc.

Integrated circuit (IC) 110 has a PWM control system that includes a control circuit 101, a connecting circuit 102, a serializer circuit 103, and an interface circuit 104. Control circuit 101 functions as a PWM control circuit. Control circuit 101 may be, for example, a micro-controller circuit, a microprocessor circuit, or a central processing unit within IC 110. As another example, control circuit 101 may include an array of programmable logic circuits that are programmed by software or by configuration data to perform the functions of a PWM control circuit.

Voltage regulator circuit 150 includes deserializer circuit 151, driver and control circuit 152, and power train circuit 153. Voltage regulator circuit 150 may include one or more integrated circuits and/or discrete circuits. Voltage regulator circuit 150 may also be referred to as a power converter circuit or as a DC/DC converter circuit.

Control circuit 101 generates parallel pulse-width modulation (PWM) data. Control circuit 101 may, for example, be programmed to generate the PWM data by software or by configuration data. The software or configuration data may, for example, be provided to control circuit 101 in signals CD. Control circuit 101 may generate the PWM data in response to a periodic clock signal MCLK that is provided to an input of control circuit 101. The PWM data may, for example, be stored in a data structure array in memory in control circuit 101 or in another area of IC 110. The PWM data generated by control circuit 101 digitally encodes the duty cycle of a serial PWM signal to be output by serializer circuit 103.

The PWM data generated by control circuit 101 is output as parallel PWM data in parallel PWM signals PWMP1. Signals PWMP1 may include any suitable number of parallel signals. Parallel signals PWMP1 are provided to inputs of connecting circuit 102. Connecting circuit 102 generates parallel PWM signals PWMP2 based on parallel PWM signals PWMP1. Connecting circuit 102 provides the parallel PWM data indicated by signals PWMP1 to serializer circuit 103 in parallel PWM signals PWMP2.

Connecting circuit 102 may be, for example, a storage circuit that stores the parallel PWM data indicated by signals PWMP1. As a specific example, connecting circuit 102 may be a first-in first-out (FIFO) circuit. In some embodiments, the FIFO circuit may be part of control circuit 101 or part of serializer circuit 103.

In embodiments in which connecting circuit 102 is a FIFO circuit, the FIFO circuit in connecting circuit 102 converts the parallel PWM data generated by control circuit 101 in signals PWMP1 from the clock domain of clock signal MCLK to the clock domain of another clock signal PCLK. Clock signals MCLK and PCLK may have different frequencies or phases. The FIFO circuit may be synchronous or asynchronous, depending on whether clock signals MCLK and PCLK are synchronous or asynchronous, respectively. PCLK may be referred to as a parallel clock signal.

Clock signals MCLK and PCLK are provided to inputs of the FIFO circuit in connecting circuit 102. The FIFO circuit stores the parallel PWM data indicated by signals PWMP1 in response to clock signal MCLK. The FIFO circuit outputs the stored parallel PWM data as signals PWMP2 in response to clock signal PCLK. The FIFO circuit in connecting circuit 102 also generates control signals CS that are provided to control circuit 101. The control signals CS generated by the FIFO circuit may include, for example, a FIFO full signal and a FIFO empty signal. The FIFO full signal indicates when the FIFO circuit is full of data (i.e., the FIFO circuit has no more storage space to store additional data). The FIFO empty signal indicates when the FIFO circuit is empty.

Parallel PWM signals PWMP2 are provided to inputs of serializer circuit 103. Clock signal PCLK is provided to another input of serializer circuit 103. A third periodic clock signal SCLK is provided to yet another input of serializer circuit 103. Clock signal SCLK may be referred to as a serial clock signal. Clock signals MCLK, PCLK, and SCLK may, for example, be generated by one or more phase-locked loop or delay-locked loop circuits. The serializer circuit 103 may, for example, be a high-speed serializer circuit (e.g., up to 20 gigahertz (GHz)) such as a SERDES interface or a low voltage differential signaling (LVDS) interface serializer.

Serializer circuit 103 includes a parallel-to-serial converter circuit that converts the parallel PWM data indicated by signals PWMP2 into serial PWM data in serial PWM signal PWMS in response to clock signals PCLK and/or SCLK. The duty cycle of serial PWM signal PWMS is the serial PWM data generated by the serializer circuit 103. The serialization rate of serializer circuit 103 may, for example, be based on the ratio between the frequency of clock signal PCLK and the frequency of clock signal SCLK or signal PWMS. The serialization rate of serializer circuit 103 may be set to a value that allows the control circuit 101 to operate at a much lower frequency than the frequency of the serial PWM signal PWMS.

The parallel-to-serial converter circuit in serializer circuit 103 may include a shift register circuit. The parallel PWM data indicated by parallel PWM signals PWMP2 are loaded into the shift register in response to the parallel clock signal PCLK. Parallel PWM data may, for example, be loaded into the shift register in each period of PCLK. The parallel PWM data stored in the shift register is serially shifted out of the shift register as serial PWM data in serial PWM signal PWMS in response to the serial clock signal SCLK. Serial PWM data may, for example, be shifted out of the shift register in each period of SCLK. In an exemplary embodiment, the least significant bit (LSB) of the serial PWM data bits from each group of parallel PWM data bits may be shifted out of the shift register first.

Serial PWM signal PWMS may be a single-ended signal on one wire or a differential signal on two wires. Serial PWM signal PWMS is transmitted outside IC 110 through one or more external wires to voltage regulator circuit 150. Serializer circuit 103 may, for example, include an output driver circuit that drives serial PWM signal PWMS from IC 110 to voltage regulator circuit 150. Serial PWM signal PWMS is provided to deserializer circuit 151 in voltage regulator 150. Deserializer circuit 151 includes a serial-to-parallel converter circuit (e.g., a shift register) that converts the serial PWM data indicated by serial PWM signal PWMS into parallel PWM data in parallel PWM signals PWMVR.

Parallel PWM signals PWMVR are provided to inputs of driver and control circuit 152. Power train circuit 153 includes one or more switch circuits (e.g., switching transistors). Driver and control circuit 152 converts the parallel PWM data indicated by parallel PWM signals PWMVR into one or more drive signals that control the on and off switching of the one or more switch circuits in the power train circuit 153. Thus, driver and control circuit 152 controls the duty cycle(s) of the one or more switch circuits in power train circuit 153 based on the parallel PWM data indicated by parallel PWM signals PWMVR. The parallel PWM data indicated by parallel PWM signals PWMVR is the same PWM data provided by control circuit 101 in signals PWMP1.

Power train circuit 153 may also include an inductor and a capacitor. Voltage regulator circuit 150 converts an unregulated input voltage $V_{IN}$ into a regulated output voltage $V_{REG}$ at its output. Voltage regulator circuit 150 may, for example, provide current from input voltage $V_{IN}$ through the one or more switch circuits and the inductor to its output at $V_{REG}$. The capacitor in power train circuit 153 helps to reduce the voltage ripple in voltage $V_{REG}$ that is caused by the switching of the one or more switch circuits in power train circuit 153.

Voltage $V_{REG}$ is provided through an external wire to interface circuit 104 in IC 110. Interface circuit 104 may, for example, include an analog-to-digital converter circuit that converts the analog value of voltage $V_{REG}$ into a set of digital signals VRGD that indicate the analog value of voltage $V_{REG}$. Digital signals VRGD are provided to inputs of control circuit 101 in IC 110.

Control circuit 101 adjusts the values of the parallel PWM data indicated by parallel PWM signals PWMP1 and PWMP2 based on changes in the voltage $V_{REG}$ as indicated by the digital signals VRGD. In response to control circuit 101 adjusting the values of the parallel PWM data indicated by signals PWMP1-PWMP2, serializer circuit 103 changes the duty cycle of signal PWMS. In response to changes in the duty cycle of signal PWMS, voltage regulator circuit 150 varies the parallel PWM data indicated by signals PWMVR, which changes the duty cycle(s) of the one or more switch circuits in power train circuit 153. Changes in the duty cycle(s) of the one or more switch circuits in power train circuit 153 cause power train circuit 153 to adjust the current provided to the output of voltage regulator circuit 150.

For example, if the voltage $V_{REG}$ decreases below a threshold voltage, control circuit 101 may adjust the values of the parallel PWM data indicated by parallel PWM signals PWMP1 to cause voltage regulator circuit 150 to provide more current from voltage $V_{IN}$ to its output in order to increase the voltage $V_{REG}$ back to the threshold voltage. If the voltage $V_{REG}$ increases above the threshold voltage, control circuit 101 may adjust the values of the parallel PWM data indicated by parallel PWM signals PWMP1 to cause voltage regulator circuit 150 to provide less current from voltage $V_{IN}$ to its output in order to decrease the voltage $V_{REG}$ back to the threshold voltage. The control circuit 101 may adjust the threshold voltage based on the varying voltage requirements of load circuits that receive voltage $V_{REG}$.

In the embodiment of FIG. 1, the serial PWM signal PWMS may have a greater frequency than can be generated by control circuit 101 for the parallel PWM data signals PWMP1 if, for example, the frequency of clock signal SCLK is greater than the frequency of clock signal MCLK. The embodiment of FIG. 1 may allow control circuit 101 to operate at a lower clock frequency than the frequency of the serial PWM signal PWMS, which may ease the timing requirements imposed on the design of control circuit 101. In some embodiments, the control circuit 101 may be programmed to generate PWM data according to different PWM protocols at different times, for example, by programming or re-programming control circuit 101 using different software or different configuration data provided to control circuit 101 in signals CD.

Figure 2:
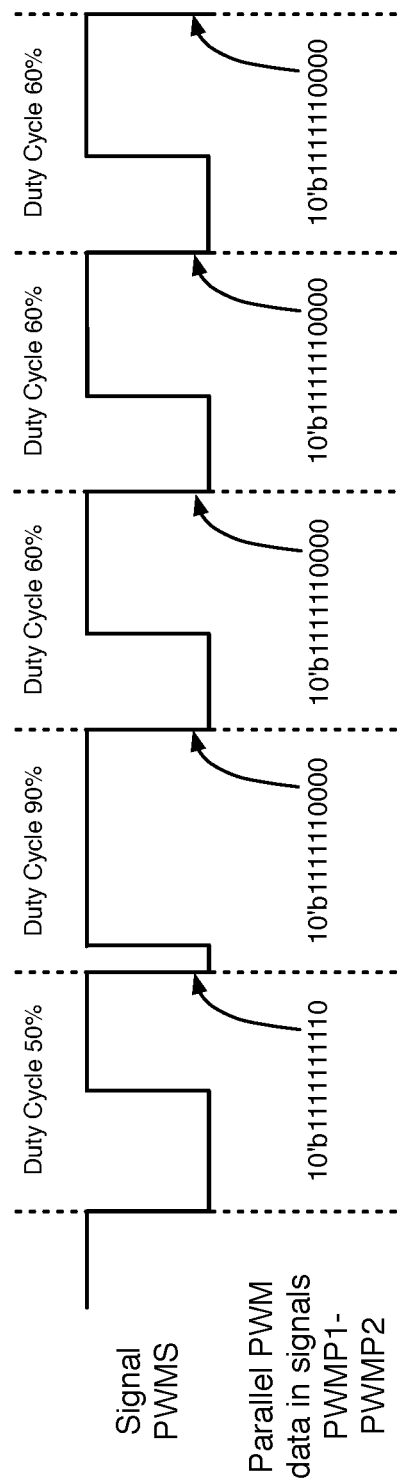
FIG. 2 illustrates an exemplary waveform of the serial PWM output signal PWMS of the serializer circuit shown in FIG. 1, according to an embodiment.

FIG. 2 illustrates an exemplary waveform of the serial PWM output signal PWMS of serializer circuit 103, according to an embodiment. As shown in the example of FIG. 2, signal PWMS has a constant frequency and a varying duty cycle. In the example of FIG. 2, serializer circuit 103 has a serial multiplication factor of 10, and signal PWMS has a default duty cycle of 50% after initialization. After initialization, serializer circuit 103 adjusts the duty cycle of signal PWMS in response to control circuit 101 adjusting the parallel PWM data indicated by signals PWMP1-PWMP2 based on changes in voltage $V_{REG}$, as described above. In the example of FIG. 2, serializer circuit 103 increases the duty cycle of signal PWMS from 50% to 90% in response to the parallel PWM data in signals PWMP2 having a hexadecimal value 10'b1111111110 that indicates a 90% duty cycle. Serializer circuit 103 then decreases the duty cycle of signal PWMS from 90% to 60% in response to the parallel PWM data in signals PWMP2 having a hexadecimal value 10'b1111110000 that indicates a 60% duty cycle. The duty cycle of signal PWMS remains at 60% for at least 3 periods in the example of FIG. 2. Control circuit 101 and serializer circuit 103 may, for example, cause the duty cycle of signal PWMS to increase and decrease in response to voltage $V_{REG}$ decreasing and increasing, respectively.

In some embodiments, different duty cycles in signal PWMS may cause voltage regulator circuit 150 to generate different voltages in $V_{REG}$. As examples that are not intended to be limiting, duty cycles in signal PWMS of 50%, 90%, and 60% may cause voltage regulator circuit 150 to generate voltages of 0.85 volts, 0.89 volts, and 0.86 volts, respectively, in voltage $V_{REG}$.

According to other embodiments, the PWM control system in IC 110 of FIG. 1 may be used in other PWM applications. For example, the PWM control system in IC 110 may be used to generate a PWM signal as a modulated data signal for data transmission between integrated circuits in a circuit system. As other examples, the PWM control system in IC 110 may be used to generate a PWM signal for controlling a motor or a photovoltaic solar battery charger. The PWM control system in IC 110 may be used in any system that uses a PWM controller, including any type of power management system.

Figure 3:
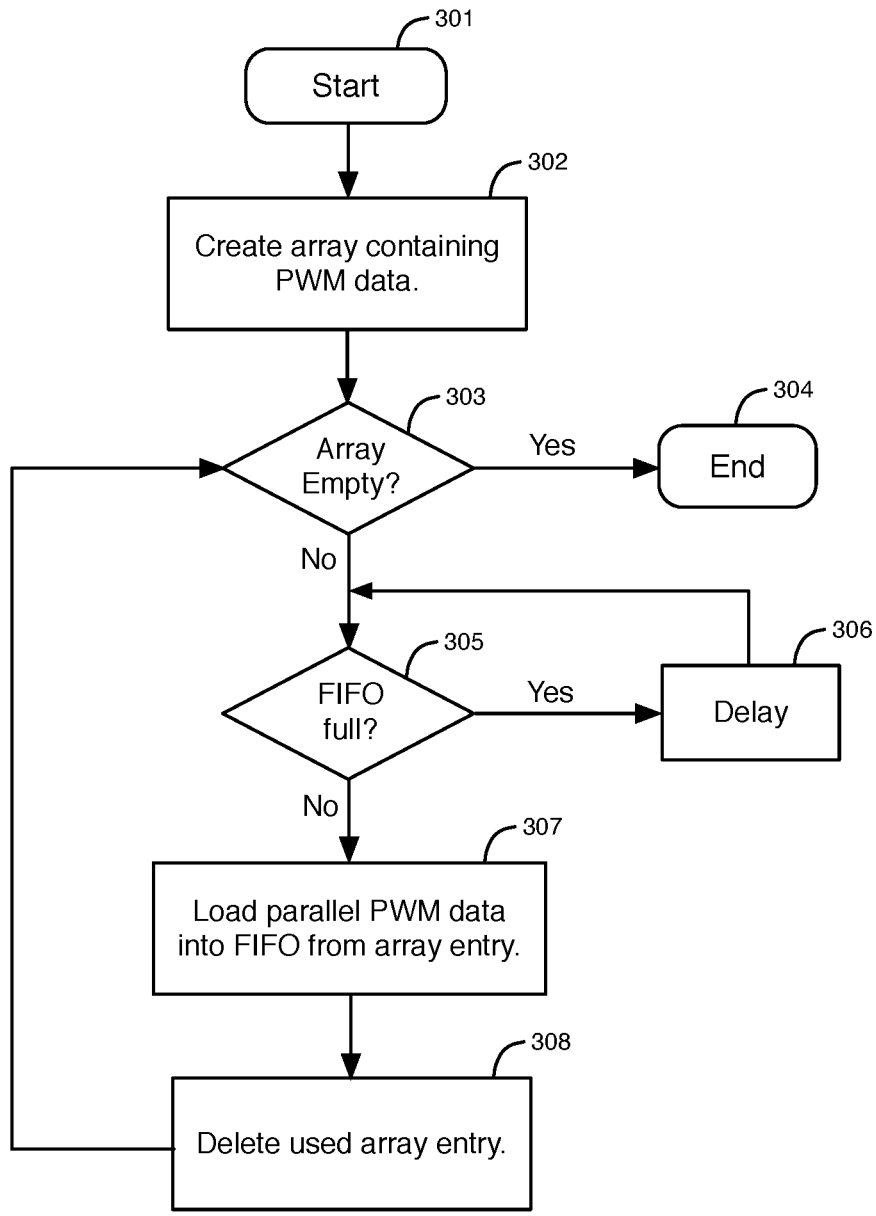
FIG. 3 is a flow chart that illustrates examples of operations that may be performed by the control circuit in the PWM control system of FIG. 1, according to an embodiment.

FIG. 3 is a flow chart that illustrates examples of operations that may be performed by control circuit 101 in the PWM control system in IC 110 of FIG. 1, according to an embodiment. In operation 301, control circuit 101 starts the PWM control process, for example, in response to an input signal from a user or from other circuitry in IC 110. In operation 302, control circuit 101 creates an array containing PWM data. The array is a data structure that is stored in memory in control circuit 101 or in another area of IC 110. In operation 303, control circuit 101 determines if the array is empty. If the control circuit 101 determines that the array is empty in operation 303, then the process ends in operation 304. If the control circuit 101 determines that the array is not empty in operation 303, control circuit 101 then determines if the FIFO circuit in connecting circuit 102 is full in operation 305. If the FIFO circuit has no storage space to store additional PWM data without overwriting PWM data that has not been output in signals PWMP2, then the FIFO circuit asserts a FIFO full signal that is provided to control circuit 101 in signals CS. Thus, control circuit 101 may determine when the FIFO circuit is full based on signals CS.

If the control circuit 101 determines in operation 305 that the FIFO circuit in connecting circuit 102 is full, control circuit 101 enters a delay mode in operation 306 during which control circuit 101 does not output PWM data for a period of time. After the delay period of time of operation 306, the control circuit 101 repeats operation 305 to determine if the FIFO circuit in connecting circuit 102 is still full. The FIFO circuit continues to output stored parallel PWM data in signals PWMP2, which causes the FIFO circuit to no longer be full after a period of time. If the control circuit 101 determines in operation 305 that the FIFO circuit in connecting circuit 102 is not full, then control circuit 101 loads parallel PWM data into the FIFO circuit from an entry in the array in operation 307. Control circuit 101 then deletes the entry from the array in operation 308 that was just loaded into the FIFO circuit in the previous iteration of operation 307. The control circuit 101 then returns to operation 303 and performs additional iterations of operations 305-308 until the array is empty, and the process ends in operation 304.

Figure 4:
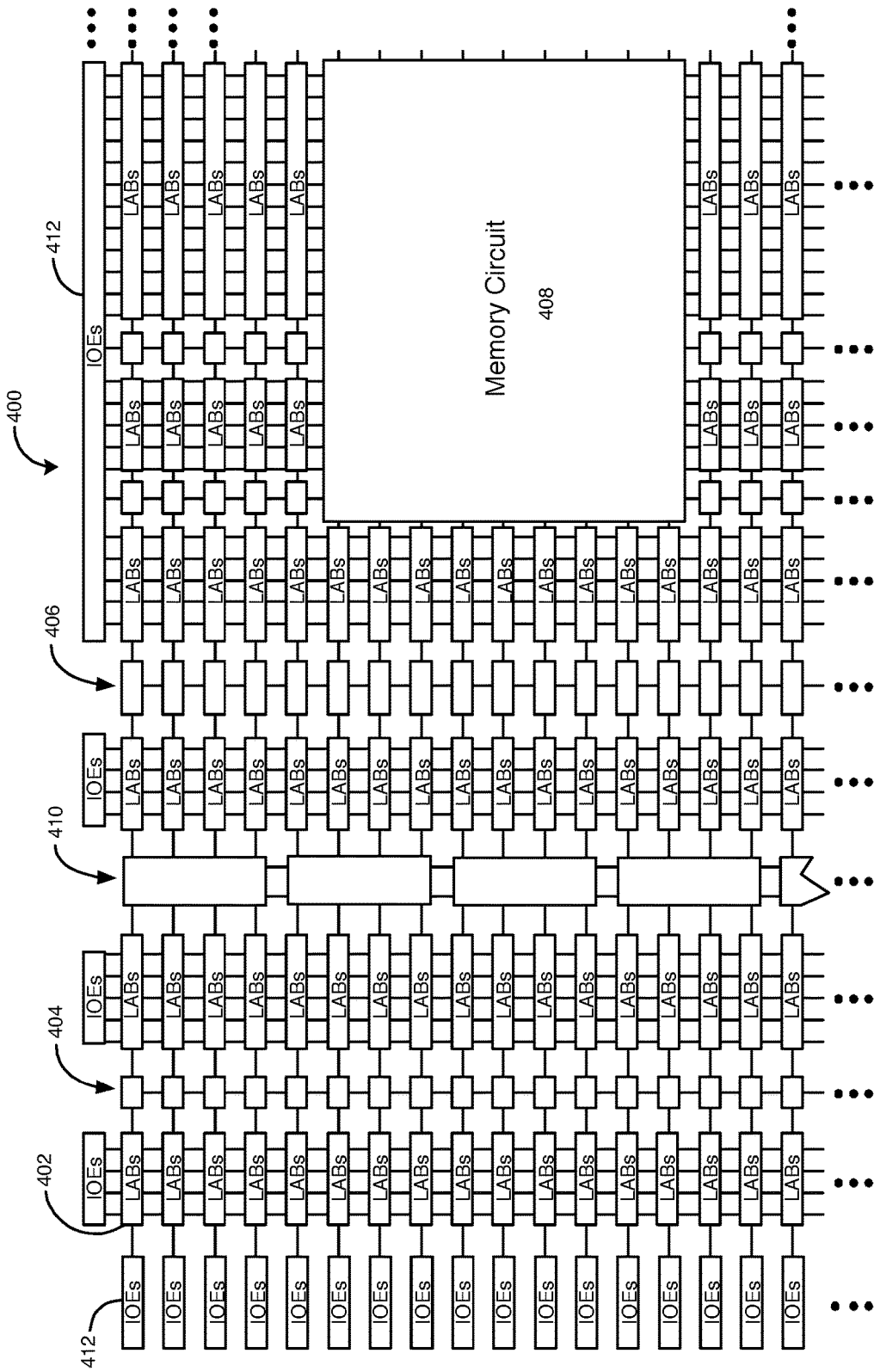
FIG. 4 is a simplified partial block diagram of a field programmable gate array (FPGA) that can include embodiments of the present invention.

FIG. 4 is a simplified partial block diagram of a field programmable gate array (FPGA) 400 that can include embodiments of the present invention. FPGA 400 is an example of an integrated circuit that can be used as integrated circuit 110. FPGA 400 is merely one example of an integrated circuit that can include features of the present invention. Embodiments of the present invention can be used in numerous types of integrated circuits, such as field programmable gate arrays (FPGAs), programmable logic devices (PLDs), complex programmable logic devices (CPLDs), programmable logic arrays (PLAs), microprocessors, central processing units, etc.

FPGA 400 includes a two-dimensional array of programmable logic array blocks (or LABs) 402 that are interconnected by a network of vertical and horizontal interconnect resources of varying length and speed. Each of LABs 402 includes multiple (e.g., 10) logic elements (or LEs).

A logic element (LE) is a programmable logic circuit that provides for efficient implementation of user defined logic functions. An FPGA has numerous logic elements that can be configured to implement various combinatorial and sequential functions. The logic elements have access to programmable interconnect resources. The programmable interconnect resources can be programmed to interconnect the logic elements in almost any desired configuration.

FPGA 400 may also include a distributed memory structure including random access memory (RAM) circuits of varying sizes provided throughout the array. The RAM circuits include, for example, circuits 404, circuits 406, and circuit 408. These memory circuits can also include shift registers and first-in first-out (FIFO) circuits.

FPGA 400 may further include digital signal processing (DSP) circuits 410 that can implement, for example, multipliers with add or subtract features. Input/output elements (IOEs) 412 located, in this example, around the periphery of the IC, support numerous single-ended and differential input/output standards. IOEs 412 are coupled to pads. Each of the pads is an external terminal of the FPGA.

The integrated circuits described herein may be part of a data processing system that includes one or more of the following components; a processor; memory; input/output circuitry; and peripheral devices.

Although the method operations were described in a specific order, it should be understood that other operations may be performed in between described operations, described operations may be adjusted so that they occur at slightly different times or in a different order, or described operations may be distributed in a system that allows the occurrence of the processing operations at various intervals associated with the processing.

The foregoing description of the exemplary embodiments of the present invention is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
a control circuit that generates parallel pulse-width modulation data in first parallel pulse-width modulation signals;
a first-in first-out circuit that stores the parallel pulse-width modulation data indicated by the first parallel pulse-width modulation signals, wherein the first-in first-out circuit outputs the stored parallel pulse-width modulation data in second parallel pulse-width modulation signals; and
a serializer circuit that converts the parallel pulse-width modulation data indicated by the second parallel pulse-width modulation signals to serial pulse-width modulation data in a serial pulse-width modulation signal.

2. The integrated circuit of claim 1, wherein the control circuit is programmed by software or configuration data to generate the parallel pulse-width modulation data.

3. The integrated circuit of claim 2, wherein the control circuit is reprogrammable to generate the parallel pulse-width modulation data based on different protocols.

4. The integrated circuit of claim 1, wherein the first-in first-out circuit stores the parallel pulse-width modulation data indicated by the first parallel pulse-width modulation signals in response to a first clock signal, and wherein the first-in first-out circuit outputs the stored parallel pulse-width modulation data in the second parallel pulse-width modulation signals in response to a second clock signal.

5. The integrated circuit of claim 4, wherein the control circuit generates the parallel pulse-width modulation data in response to the first clock signal, and wherein the serializer circuit converts the parallel pulse-width modulation data to the serial pulse-width modulation data in response to the second clock signal and in response to a third clock signal.

6. The integrated circuit of claim 1, wherein the first-in first-out circuit generates a full signal that is provided to the control circuit, and wherein the control circuit only provides the parallel pulse-width modulation data to the first-in first-out circuit in the first parallel pulse-width modulation signals in response to the full signal indicating that the first-in first-out circuit is not full.

7. The integrated circuit of claim 1, wherein the serializer circuit varies a duty cycle of the serial pulse-width modulation signal based on changes in the parallel pulse-width modulation data generated by the control circuit.

8. The integrated circuit of claim 1, further comprising:
an interface circuit that receives a regulated voltage from a voltage regulator circuit, wherein the interface circuit generates digital signals that indicate the regulated voltage, wherein the digital signals are provided to the control circuit, and wherein the control circuit adjusts the parallel pulse-width modulation data based on changes in the regulated voltage generated by the voltage regulator circuit.

9. The integrated circuit of claim 1, wherein the control circuit comprises programmable logic circuits, and wherein the integrated circuit is a programmable logic integrated circuit.

10. An integrated circuit comprising:
a control circuit that generates parallel pulse-width modulation data in first parallel pulse-width modulation signals in response to a first clock signal;
a first-in first-out circuit that stores the parallel pulse-width modulation data indicated by the first parallel pulse-width modulation signals in response to the first clock signal, wherein the first-in first-out circuit outputs the stored parallel pulse-width modulation data in second parallel pulse-width modulation signals in response to a second clock signal; and
a serializer circuit that converts the parallel pulse-width modulation data indicated by the second parallel pulse-width modulation signals to serial pulse-width modulation data in a serial pulse-width modulation signal in response to the second clock signal.

11. The integrated circuit of claim 10, wherein the serializer circuit converts the parallel pulse-width modulation data to the serial pulse-width modulation data in response to a third clock signal, and wherein a frequency of the third clock signal is greater than frequencies of the first and second clock signals.

12. The integrated circuit of claim 10, wherein the control circuit is reprogrammable to generate the parallel pulse-width modulation data based on different pulse-width modulation protocols.

13. The integrated circuit of claim 10, further comprising:
an interface circuit that receives a regulated voltage from a voltage regulator circuit, wherein the interface circuit generates digital signals that indicate the regulated voltage, wherein the digital signals are provided to the control circuit, and wherein the control circuit adjusts the parallel pulse-width modulation data based on changes in the regulated voltage as indicated by the digital signals.

14. The integrated circuit of claim 10, wherein the control circuit comprises programmable logic circuits, and wherein the integrated circuit is a programmable logic integrated circuit.

15. The integrated circuit of claim 10, wherein the serializer circuit varies a duty cycle of the serial pulse-width modulation signal based on changes in the parallel pulse-width modulation data indicated by the second parallel pulse-width modulation signals.

16. A method comprising:
generating parallel pulse-width modulation data in first parallel pulse-width modulation signals using a control circuit in an integrated circuit;
storing the parallel pulse-width modulation data indicated by the first parallel pulse-width modulation signals in a first-in first-out circuit in the integrated circuit in response to a first clock signal;
outputting the stored parallel pulse-width modulation data from the first-in first-out circuit in second parallel pulse-width modulation signals in response to a second clock signal; and
converting the parallel pulse-width modulation data indicated by the second parallel pulse-width modulation signals to serial pulse-width modulation data in a serial pulse-width modulation signal using a serializer circuit in the integrated circuit.

17. The method of claim 16, wherein the control circuit generates the parallel pulse-width modulation data in response to the first clock signal, and wherein the serializer circuit converts the parallel pulse-width modulation data to the serial pulse-width modulation data in response to the second clock signal.

18. The method of claim 16, further comprising:
generating digital signals that indicate a regulated voltage received from a voltage regulator circuit using an interface circuit in the integrated circuit;
providing the digital signals to the control circuit; and
adjusting the parallel pulse-width modulation data based on changes in the regulated voltage as indicated by the digital signals using the control circuit.

19. The method of claim 16, further comprising:
programming the control circuit to generate the parallel pulse-width modulation data based on a first pulse-width modulation protocol; and
reprogramming the control circuit to generate the parallel pulse-width modulation data based on a second pulse-width modulation protocol.

20. The method of claim 16, further comprising:
varying a duty cycle of the serial pulse-width modulation signal based on changes in the parallel pulse-width modulation data using the serializer circuit.

* * * * *